United States Patent
Simonutti

Patent Number: 5,757,241
Date of Patent: May 26, 1998

[54] PULSE AMPLIFICATION APPARATUS AND METHOD

[75] Inventor: Mario D. Simonutti, South Deerfield, Mass.

[73] Assignee: Millitech Corporation, South Deerfield, Mass.

[21] Appl. No.: 778,008

[22] Filed: Dec. 31, 1996

[51] Int. Cl.$^6$ .............. H03B 28/00; H04B 1/02; H04B 10/04

[52] U.S. Cl. .............. 331/55; 331/56; 331/172; 359/180; 359/188; 455/91

[58] Field of Search .............. 331/55, 56, 74, 331/86, 96, 107 DP, 172, 173; 359/152, 153, 174, 179, 180, 188; 455/91

[56] References Cited

U.S. PATENT DOCUMENTS

| | | | |
|---|---|---|---|
| 2,468,237 | 4/1949 | Sanders, Jr. et al. | 332/44 |
| 2,475,474 | 7/1949 | Bruck et al. | 250/6 |
| 2,509,789 | 5/1950 | Sprague et al. | 250/17 |
| 2,597,327 | 5/1952 | Hollingsworth et al. | 175/183 |
| 2,912,581 | 11/1959 | De Lange | 250/27 |
| 3,588,727 | 6/1971 | Seidel | 330/34 |
| 4,048,583 | 9/1977 | Nigrin | 331/56 |
| 4,598,262 | 7/1986 | Chen | 333/208 |
| 4,634,992 | 1/1987 | Brown | 330/47 |
| 4,825,175 | 4/1989 | Tsuda et al. | 330/286 |
| 4,826,314 | 5/1989 | Comte | 356/73.1 |
| 4,902,985 | 2/1990 | Arthur et al. | 330/287 |
| 5,432,482 | 7/1995 | Bailey | 331/56 |
| 5,652,548 | 7/1997 | Lee et al. | 331/55 |

*Primary Examiner*—David Mis
*Attorney, Agent, or Firm*—Pepe & Hazard LLP

[57] ABSTRACT

An electromagnetic radiation reflection amplifier capable of amplifying cw or pulsed signals has a pair of cw oscillators operated under injection locking conditions. Diversion of oscillator power to a separate signal path during the off time of the input pulse is achieved through purely passive means; no active control devices are utilized. The device can be implemented for amplification of microwave, millimeter wave or optical signals. The amplifier comprises a 180-degree hybrid coupler, a matched pair of cw oscillator modules, a waveguide discontinuity, a waveguide termination, and an optional signal input element. For a magic-tee hybrid coupler, the cw oscillator modules are mounted on the ports of the symmetrically positioned waveguide arms and the waveguide discontinuity is located within either the sum arm or difference waveguide arm intermediate its ends. The waveguide termination is located at the port of that arm, and the port of the other non-symmetric arm of the magic-tee becomes the input/output port.

17 Claims, 5 Drawing Sheets

PULSE AMPLIFICATION APPARATUS AND METHOD

BACKGROUND OF THE INVENTION

The present invention relates to devices for the amplification of electromagnetic radiation and, more particularly, to microwave and lightwave reflection amplifier type circuits for amplification of pulsed radio frequency (RF) and pulsed lightwave signals.

In general, pulse amplification, or the amplification of RF or lightwave pulses without appreciably changing their waveforms, can be obtained from a single reflection amplifier module when the module is adjusted for the conventional stable amplifier mode of operation. This mode of operation is also termed "negative resistance mode". The term "microwave" as used herein is intended to encompass the 1–200 Ghz frequency region of the electromagnetic spectrum, and the term "lightwave" is intended to encompass the range above 200 Ghz. The term "waveguide" as used herein is intended to encompass both microwave and lightwave types of transmission line media, including fiber optics.

Recently, Arthur et al U.S. Pat. No. 4,902,985 proposed an RF power combining amplifier using multiple, individually stable, reflection amplifier modules. This device is capable of amplifying both cw and pulsed RF signals. Although the Arthur amplifier offers an advantage over prior art devices, there are situations where amplification of pulsed RF signals is required, but where producing such stable reflection amplifier modules is not desirable or not possible, while modules operating in the injection locking mode may be available as described by K. Kurokawa, "Injection Locking of Microwave Solid-State Oscillators," *Proceedings of the IEEE*, Vol. 61, No. 10, October 1973, pp. 1386–1410. However, for the amplification of pulsed RF signals using injection locked oscillators, it is normally necessary to pulse on and off the bias current to the injection locked oscillator modules in synchronism with the RF input pulses. This may not always be possible or practical. It would often be desirable to have a system wherein continuously running injection locked oscillator modules could be used for amplification of pulsed signals.

Injection locking is a technique whereby amplification of cw input signals may be achieved using a one-port oscillator. A relatively low power signal is directed into the oscillator using a circulator or other means. For suitable conditions of minimum input power level and input frequency sufficiently close to the free-running frequency of the oscillator, the oscillator will oscillate preferentially at the injected frequency. The injection source can be a voltage controlled oscillator in which case electronic control of the frequency of the lower power oscillator affords control of the higher power oscillator output. Injection locking has the advantage of preserving the spectral purity of the low power injection signal, while realizing the output power capability of the higher power oscillator which is being injection locked. When the injection input signal is removed, the higher power oscillator then returns to its free-running frequency. Therefore, this configuration is not directly applicable to the amplification of pulsed signals for which the input signal is effectively switched on and off, and where the output power should follow accordingly the on and off conditions of the input.

An IMPATT diode in a suitable circuit module or cavity can be used as a high power oscillator. When increased output power is required, multiple IMPATT diodes can be power combined (with IMPATT diodes operating in separate cavities combined by couplers, or with multiple IMPATT diodes operating within a single shared cavity) with little loss of efficiency. Where greater spectral purity is required of the oscillator output signal, Gunn-effect diodes can be used instead of IMPATT diodes, although Gunn-effect diodes produce significantly less power.

The conventional approach for achieving pulse amplification with injection locked oscillator modules is to pulse the bias of the active devices on and off in synchronism with the pulsed RF input signal. This eliminates the free-running output power which would otherwise be present from the oscillator when the input signal is removed. Although often effective, this approach has potential disadvantages: 1) during the pulse ON time, the pulsing of the bias to the active device creates a large temperature transient within the semiconductor active region which often produces unacceptable transients of noise, spurious outputs, and/or phase transients on the amplified signal; 2) the pulse bias approach requires a synchronizing gate signal for timing the pulse bias electronics, and this may be difficult or impossible to derive in some applications; 3) pulse bias electronics are often associated with unacceptable rise-time and fall-time speed limitations; and 4) pulse circuitry represents greatly increased complexity over dc circuitry.

Recently, Bailey U.S. Pat. No. 5,432,483 proposed a pulsed RF signal amplifier using one or more injection locked IMPATT oscillators as RF power sources. In order for the Bailey device to amplify pulsed RF signals, the bias currents to the individual IMPATT oscillators must be pulsed ON and OFF by external means, and in synchronization with the RF input pulse to be amplified. Although the Bailey amplifier offers many advantages over prior art devices, it is sometimes not possible to switch the RF generating components by external means. It would sometimes be desirable to utilize continuously running RF oscillators which are adapted to injection locking in a scheme for the amplification of pulsed RF signals.

Accordingly, it is an object of the present invention to provide a novel reflection microwave and lightwave amplifier which utilizes a pair of continuously running cw injection locked oscillator modules.

It is also an object is to provide such an amplifier which eliminates the need for pulse bias electronics, thereby eliminating the rise-time and fall-time speed limitations associated with their use.

Another object is to provide such an amplifier for high spectral purity power amplification of high speed pulsed and cw microwave and lightwave signals.

A further object is to provide such an amplifier which will allow use of injection locked oscillators utilizing two-terminal active devices in both fundamental and harmonic modes of operation, therefore enabling operation above 120 Ghz which is the approximate practical upper frequency limit for fundamental mode operation of Gunn and IMPATT oscillators.

SUMMARY OF THE INVENTION

It has now been found that the foregoing and related objects may be readily attained in an electromagnetic radiation reflection amplifier comprising a 3 dB 180-degree hybrid coupler, a matched pair of continuously running (cw) oscillator modules, a waveguide discontinuity, a low reflection waveguide termination, and a means for inputting the signal to be amplified. A magic-tee implementation of a 3 dB, 180-degree hybrid coupler includes four waveguide arms: two symmetric arms, a sum arm, and a difference arm, each of the four waveguide arms having terminal ports with the pair of cw oscillator modules being mounted on the symmetric ports.

The waveguide discontinuity, which is used to produce a reflection of controlled amplitude and phase, is mounted within either of the sum and difference waveguide arms intermediate its ends, and the matched waveguide termination is placed on the terminal port of the same arm containing the discontinuity. The means for inputting a signal is mounted on the remaining of the sum or difference arm terminal port, the port of that arm not containing the waveguide discontinuity. Such means of inputting the external signal to be amplified must be such as to maintain a matched condition, i.e. low return loss, looking into that terminal port from the 3 dB 180-degree hybrid coupler.

The amplifier has three modes of operation: an idle mode, an amplification mode, and an unlocked mode:

During the idle mode of operation in which no external input signal is applied, the pair of matched oscillator modules, under control of the reflection produced by the waveguide discontinuity, inter-injection lock to each other thereby producing a single frequency, power combined signal. The reflection produced at the discontinuity divides at the junction of the magic-tee to produce two equal-amplitude signals in the symmetric arms. These two signals are, in effect, the injection locking input signals for the oscillators. The single-frequency inter-injection locked oscillation is effectively a free-running oscillation since it is not synchronized to an external reference. The resulting single frequency produced is in the vicinity of the free-running frequencies of the matched oscillator pair. The precise frequency of this oscillation is determined primarily by three factors: 1) the position of the waveguide discontinuity along the waveguide axial direction, since this determines the phase of the signal reflected back into the oscillator modules, 2) the magnitude of the reflection which the discontinuity produces, and 3) the injection locking characteristics of the pair of matched oscillators. These characteristics are determined largely by the oscillator's free-running frequency, its output power, and its external Q.

The inherent characteristics of the magic-tee, the action of the waveguide discontinuity in reflecting a controlled amount of the composite output signal back into the oscillator pair to achieve inter-injection locking, and the matched or reflectionless condition maintained at the other sum or difference port not containing the discontinuity, work together to cause the power combined output signal to emerge entirely from the port of the waveguide arm containing the discontinuity. Therefore, during this idle mode, the cw power combined signal is dumped into the low reflection waveguide termination which is located on the waveguide arm containing the discontinuity, and a deep null is achieved in the power level emerging at the other sum or difference waveguide arm not containing the discontinuity.

If the waveguide discontinuity is located within the difference waveguide arm of the magic-tee, the oscillator modules operate with a relative phase difference of 180-degrees during the inter-injection locked condition of the idle mode. If the waveguide discontinuity is located within the sum arm of the magic-tee, then the oscillator modules operate in-phase during the inter-injection locked condition of the idle mode.

During the amplification mode of operation, the means for inputting inputs an externally generated signal into the port of the other of the sum or difference waveguide arms not containing the waveguide discontinuity. The externally applied input signal is of an amplitude which is sufficient to accomplish injection locking of the pair of cw oscillator modules to the externally applied input signal. Under this condition, the modules power combine, and the phasing of the configuration is such that the power combined output signal is directed back to the port at which the external input signal is applied. The modules are no longer inter-injection locked, and there is a null in the power directed to the waveguide arm containing the discontinuity. In the amplification mode, the externally applied input signal may be modulated in frequency within the limits of an effective injection locking bandwidth which will be defined in a later section.

If the externally applied input signal is input from the sum waveguide arm of the magic-tee (waveguide discontinuity located in the difference arm), the oscillator modules operate in-phase during the injection locked condition of the amplification mode. If the externally applied input signal is input from the difference arm of the magic-tee (waveguide discontinuity located in the sum arm), then the oscillator modules operate with a relative phase of 180-degrees.

When the externally applied signal is removed, the configuration transfers back to the idle mode in which no power emerges from the port into which the input signal was previously applied, and the full combined power of the oscillators dumps to the waveguide termination. Therefore, for both the idle mode and the amplification mode, the configuration maintains a power combining condition on the cw oscillators and effects a path switching action on the combined power. The path of the switching action is determined by the presence or absence of the externally applied input signal. This switching is accomplished by purely passive means with no active control devices employed.

An unlocked mode of operation exists for the case where a finite input signal is applied, but where that signal is of insufficient amplitude to accomplish the condition of injection locking of the oscillator pair. In this case, the oscillators will emit multiple frequencies and spurious outputs, and the oscillator power will divide in an uncontrolled manner between the two non-symmetric arms of the magic-tee. The unlocked mode may readily be avoided by suitable control of the amplitude and frequency range of the input signal.

Preferably, the means for inputting an external signal includes a matched circulator having three low return loss waveguide arms each having terminal ports, with the first port of the circulator mounted on the port of the other non-symmetric waveguide arm not containing the waveguide discontinuity. The input signal is applied to the second port of the circulator during the amplification mode of operation, and the amplified output signal, which enters the first port of the circulator, is steered by circulator action out of the third port of the circulator.

Desirably, the means for inputting a signal includes an isolator coupled to the second port of the circulator, and an isolator coupled to the third port of the circulator. The function of the isolators is to maintain a low reflection condition looking into the first port of the circulator from the mating sum or difference port of the 3 dB 180-degree hybrid coupler for conditions when the external equipment attached at input or output signal ports of the circulator may not have low return loss.

In the case of a microwave amplifier, the circulator is preferably a magnetized Y-junction ferrite circulator. In the case of a lightwave amplifier, the circulator is preferably a crystalline Faraday rotation circulator and the cw oscillator modules are lasers.

Generally, the 3 dB 180-degree hybrid coupler is a magic-tee, and the inherent phasing properties of the magic-tee coupler enable the power combining of the output signals from the oscillator modules into a single output signal. Other implementations of a 3 dB 180-degree hybrid coupler besides the magic-tee are applicable.

Desirably, the oscillator modules have approximately matched free-running frequencies and output amplitudes, have approximately matched injection locking characteristics as would be accomplished if they are implemented in matched circuit hardware and use matched power generating active devices, and the externally applied input signal has a minimum amplitude and is within an operating frequency band approximately centered at the free-running frequency of the oscillators, the minimum amplitude of the externally applied input signal and its operating bandwidth which are to be defined later in this application, to cause the oscillator modules to injection lock to the externally applied input signal resulting in a single-frequency, or coherent, power combined injection locked output.

DETAILED DESCRIPTION OF THE PREFERRED EMBODIMENT

Figure 1:
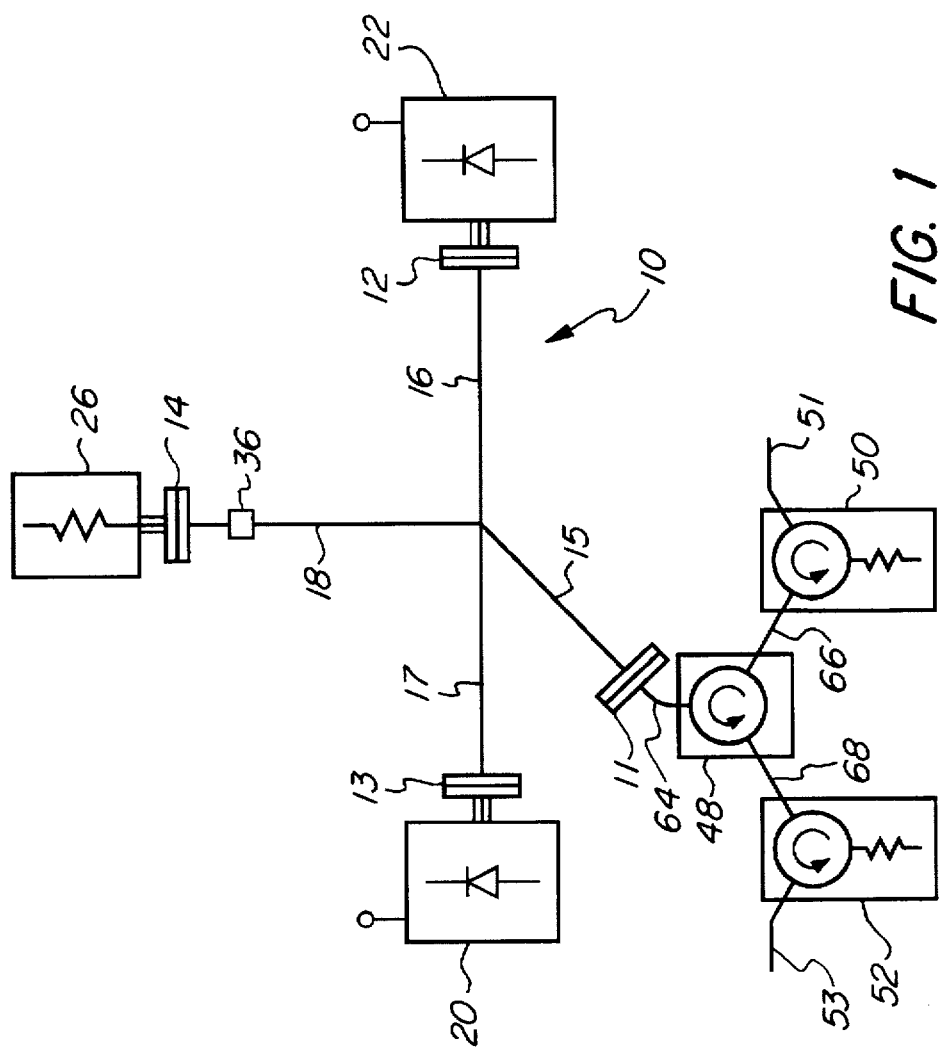
FIG. 1 is a schematic illustration of a reflection amplifier embodying the present invention.

Turning first to FIG. 1, therein schematically illustrated is a reflection microwave amplifier embodying the present invention which utilizes a magic-tee implementation of a 3 dB 180-degree hybrid coupler generally designated by the numeral 10 and having a pair of symmetrically situated waveguide arms 16, 17 terminating at ports 12, 13, and two non-symmetrically situated waveguide arms 15, 18 terminating at ports 11, 14. A matched pair of continuously running (cw) oscillator modules 20, 22 is coupled to the symmetrical ports 12, 13 of the magic-tee coupler 10. The nominal free-running frequency of the matched oscillator modules determines the approximate center frequency of the operating band of this reflection amplifier.

A waveguide discontinuity 36 is disposed within one of the two non-symmetrical waveguide arms 18 which is terminated with a waveguide termination 26. One of the three waveguide arms 64 of a Y-junction circulator 48 is coupled to the remaining port 11 of the magic-tee coupler 10, and input and output isolators 50, 52 are attached to the remaining arms 66, 68 of the Y-junction circulator 48. The isolators are represented as terminated Y-junction circulators. Port 51 is the signal input port of the reflection microwave amplifier, and port 53 is the output port.

Figure 2:
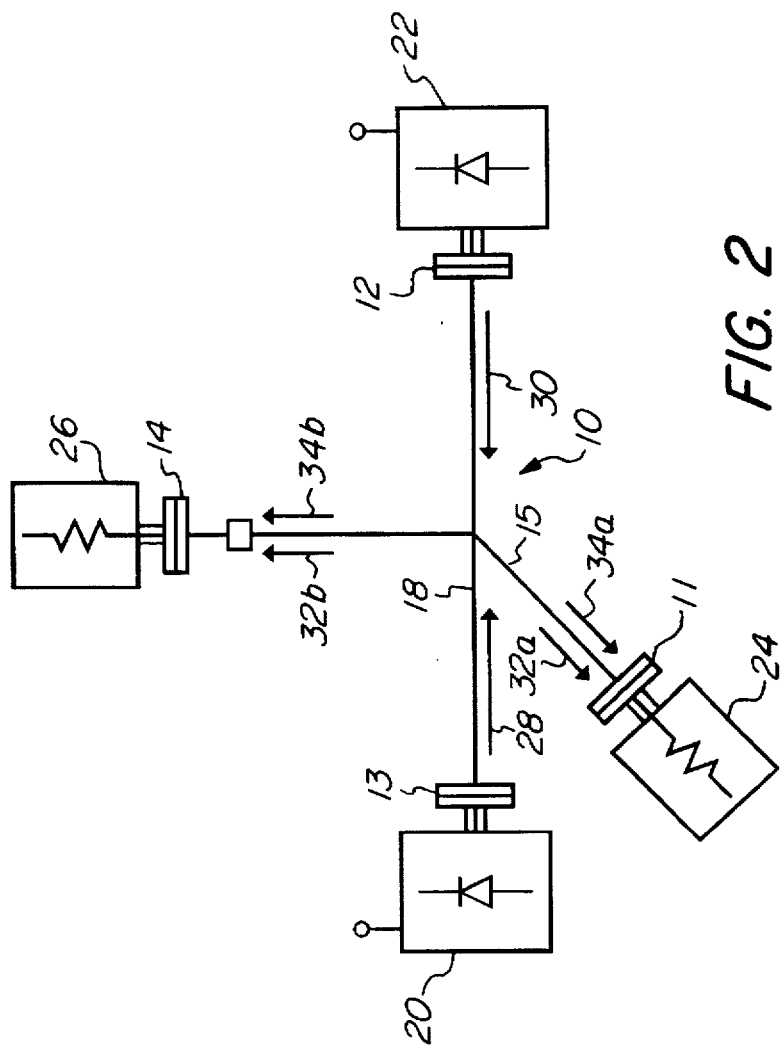
FIG. 2 is a schematic illustration of an idealized magic-tee implementation of a 3 dB 180-degree hybrid coupler using a matched pair of cw waveguide oscillators mounted on the symmetric arms of the magic-tee, and using two reflectionless waveguide terminations.

Turning next to FIG. 2, therein schematically illustrated is an ideal isolated and individually free-running cw oscillator pair mode of operation. This example is presented to provide background to assist in describing the principle of operation of the invention. An idealized magic-tee coupler 10 having perfect isolation between the symmetric waveguide arm ports 12, 13 has a matched pair of cw oscillator modules 22, 20 mounted to these ports 12, 13, and the remaining two ports 11, 14 are terminated with reflectionless waveguide terminations 24, 26. No waveguide discontinuity is installed. In this example, the characteristics of the oscillator modules 20, 22 are considered closely matched in frequency, although a small, finite difference between their individual frequencies is assumed. For consistency with the examples to follow later, the oscillator modules 20, 22 are also considered closely matched in amplitude.

In this ideal state, because of the assumed perfect isolation between the symmetrical ports of the magic-tee and the reflectionless property of the waveguide terminations, there is perfect isolation between the two oscillator modules 20, 22. Under this condition of perfect isolation, the cw oscillator modules 20 and 22 oscillate independently, each at its own free-running frequency. At the junction of the magic-tee, the individual outputs 28, 30 from each of the two isolated cw oscillators 20, 22 each divide equally between the two non-symmetric arms 15, 18 of the magic-tee coupler 10. This results in equal amplitude output signals 32a and 32b originating from and having the frequency of oscillator 20, and equal amplitude output signals 34a and 34b originating from and having the frequency of oscillator 22. The pair of signals 32a and 34a emerges at port 11, and the pair of signals 32b and 34b emerges at port 14. For this ideal isolated condition, the same conclusions hold even where the amplitudes of the oscillator output powers are not matched but differ arbitrarily.

For the practical case in which the magic-tee coupler 10 is not ideal (which is not shown in FIG. 2), and/or the waveguide terminations are not reflectionless, the isolation between the two oscillators is not perfect. Therefore, there would be finite coupling of undetermined magnitude and phase between the two oscillators 20, 22. The magnitude and phase of this coupling is determined by the non-ideal, residual isolation characteristics of the magic-tee and by the finite return loss characteristics of the waveguide terminations. Accordingly, the oscillators 20, 22 will interact, and, depending upon the precise characteristics of the non-ideal configuration, one or the other of two mutually exclusive conditions will result:

1. The two oscillators may inter-injection lock resulting in a coherent oscillation at a single frequency. In this case the resulting single frequency output signal will divide in power between the two non-symmetrical arms 15 and 18 of the magic-tee. In general, the division of output power between the two non-symmetric arms will be unequal. This division is determined by the relative phase between the two inter-injection locked oscillators, and this phase is determined by the residual, non-ideal parameters of the magic-tee and waveguide terminations.

2. The coupling between the oscillators may be such that they fail to inter-injection lock and will instead interact in a manner to produce multiple output frequencies including spurious oscillations. The resulting power produced among the multiple frequencies and spurious outputs will divide between the two non-symmetrical arms of the magic-tee in an undetermined manner.

Figure 3:
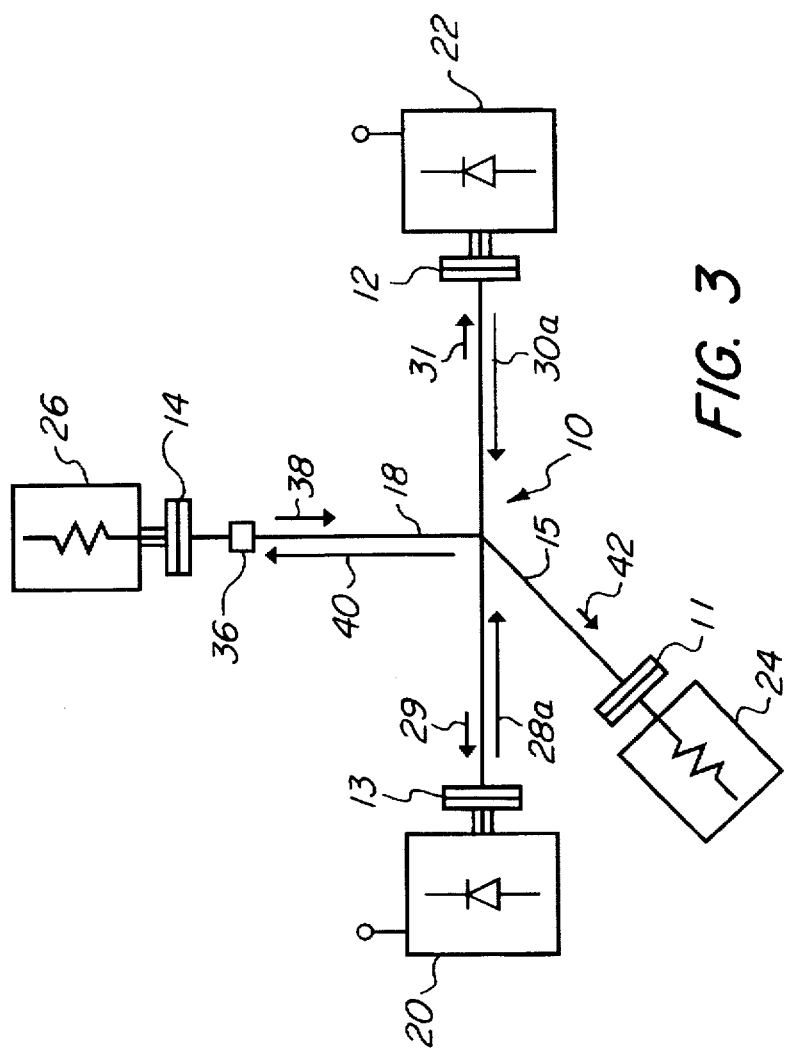
FIG. 3 is a schematic illustration of the configuration of FIG. 2 with the addition of a waveguide discontinuity placed within one of the two non-symmetric arms of the coupler.

Turning next to FIG. 3, therein schematically illustrated is a configuration representing a controlled idle mode of operation. A discontinuity 36 characterized by reflection coefficient r is placed in either one of the two non-symmetric waveguide arms 15, 18 of the magic-tee coupler 10. The purpose of the discontinuity is to produce a reflection of controlled amplitude and phase. The amplitude of the reflection can be controlled by adjusting the physical size of the discontinuity, and the phase of the reflection can be adjusted by varying its longitudinal position within the waveguide arm.

With this discontinuity 36 in place in the waveguide arm 18, the two oscillator ports 12, 13 are no longer perfectly isolated. For example, power produced by either oscillator splits equally at the magic-tee junction into the two non-symmetrical arms, and the half of the power from either oscillator which enters waveguide arm 18 is incident upon the discontinuity 36. In turn, a reflected signal is generated at the discontinuity. This reflected signal will divide equally in amplitude at the magic-tee junction to produce a pair of signals in the symmetric arms, and directed back into the oscillators 20, 22. Therefore, in this configuration, a controllable sample of the power produced from one oscillator will couple to the other as a result of reflection from the inserted discontinuity 36.

It will first be assumed that, under control of the coupling established by the discontinuity, the two oscillators inter-injection lock thereby producing a single frequency, and the consequences of this will be examined. Power from this single frequency oscillation which enters waveguide arm 18, encounters discontinuity 36, thereby producing reflection 38 which, after splitting equally at the magic-tee junction, becomes incident signals 29 and 31 which serve as the input signals for the inter-injection locking of the oscillator pair. Power from the single frequency oscillation which enters waveguide arm 15 becomes completely absorbed in the reflectionless termination 24 thereby producing no reflected signal which could otherwise return to act as input signals to the oscillators. Therefore, incident signals 29 and 31 are generated from discontinuity 36, and they control the inter-injection locking condition.

Since signals 29 and 31 are derived from the equal split of signal 38 at the magic-tee junction, the relative phase between the two signals 29 and 31 is well defined. There are two possibilities: (1) signal 29 and 31 are 180-degrees out-of-phase if the discontinuity is located in the difference arm of the magic-tee, or (2) signals 29 and 31 are in-phase if the discontinuity is located in the sum arm. Since these equal amplitude signals 29 and 31 are the input signals for the inter-injection locking of the matched oscillator pair, the phases of the output signals of the matched oscillator pair are accordingly either 180-degrees out-of-phase or in-phase, as determined by the waveguide arm in which the discontinuity 36 is located. This situation results in the steering of the composite signal 40 generated by the inter-injection locking of the oscillators on the magic-tee entirely to the waveguide arm containing the discontinuity 36. This signal 40 represents power combining of the outputs of the oscillators. In the ideal case, no power emerges from the remaining non-symmetric waveguide arm 15 not containing the discontinuity. Signal 42 in FIG. 3 is shown to represent a low-level residual signal which would be present in waveguide arm 15 as a consequence of the non-ideal properties of the components.

In practice, there is a minimum value required of the magnitude of the reflection coefficient r of the discontinuity 36 to achieve a well-controlled state of inter-injection locking establishing the idle mode as described. The magnitude of the reflection coefficient must be sufficiently large such that the signals generated by the reflection at the discontinuity dominate other residual effects of coupling between the oscillators resulting from the imperfect isolation and return loss of the magic-tee and the imperfect return loss of the waveguide terminations. In practice, this condition can be readily achieved through selection of a magic-tee with adequate performance parameters, and by selection of a waveguide discontinuity of sufficiently large return loss.

For example, given an ideal magic-tee, selecting a discontinuity 36 having a return loss on the order of 16 dB results in an isolation of 22 dB between the two oscillators 20, 22, i.e., beginning with the full output of one of the oscillators there is a 3 dB reduction accounting for the equal split at the magic-tee junction into the non-symmetric arms, plus a 16 dB return loss for the reflection at the discontinuity, plus an additional 3 dB for the split of that reflected power at the waveguide junction into the symmetric arms. This 22 dB of controlled coupling between symmetric arms produced by a discontinuity having return loss of 16 dB compares with an estimated residual isolation of 32 dB which can be achieved for the symmetric arms of a magic-tee and 40 db for waveguide terminations in practical hardware realizations. This results in an approximately 10 dB greater level of signal produced by the discontinuity compared with residual signal levels resulting from the imperfect characteristics of the magic-tee would be sufficient to control the inter-injection locking to produce a well-established idle mode.

Besides controlling the amplitude of the reflection produced by the discontinuity 36, control of its phase must be considered. The position of the discontinuity along the direction of the waveguide controls the relative phase between the oscillator output signal and its injection locking input signal which originates from the discontinuity. The Adler injection locking formula, which is presented by Kurokawa, supra, describes the relationship between the relative phase of the input and output signals of an injection locked oscillator, and the oscillator frequency. Alternatively, this phenomenon may be viewed as a load-pull effect where the frequency of the oscillator is controlled by the phase of the reflection back into the oscillator. Viewed either way, varying the phase of the reflection, as by moving the discontinuity in the longitudinal direction of the waveguide, will vary the frequency of the inter-injection locked oscillation in this configuration. Furthermore, varying the position of the discontinuity also changes the effective Q of the resulting inter-injection locked oscillation, although this is not a major effect concerning the basic principle of operation of the invention. In practice, an optimum location for the discontinuity can be determined experimentally.

For the idle mode of this configuration, the depth of the null in the power emerging from the waveguide port not containing the discontinuity may be limited in practice by imperfections of the magic-tee and terminations and by imbalances in the assumed matched pair of oscillator modules. The residual signal 42 of FIG. 3 represents the existence of an imperfect null resulting from these imperfections. The depth of this idle mode null can be increased by making fine tuning adjustments to each of the oscillator modules while monitoring the depth of the null using a power sensor placed on the port 11 in place of the termination 24. These fine tuning adjustments on the oscillator modules can serve to compensate for the imperfections in the practical hardware to produce a deep idle mode null. In practice, an idle mode null of 35 dB down for the signal 42 relative to the power directed out of the port 14 and into the termination 26 should be readily achievable.

For the case in which the reflection coefficient r associated with the waveguide discontinuity 36 is not set sufficiently large relative to the residual imperfections of the components to adequately control the oscillators to achieve the idle mode condition as described, then either of two conditions may result:

1. The two oscillators may still inter-injection lock resulting in a single frequency oscillation, but, with the process not strongly dominated by the discontinuity and instead affected appreciably by the non-ideal characteristics of the components, the relative phase of the inter-injection locked oscillator pair may not be well controlled. In this case, the single frequency power of the oscillator pair will divide between the two non-symmetrical waveguide arms in an indeterminate manner, and without a deep null in the power emerging from the port not containing the discontinuity.

2. The oscillators may fail to inter-injection lock and, since there is finite coupling between the two oscillators, they will interact to produce multiple output frequencies including spurious oscillations. The power produced among the multiple frequencies and spurious outputs will divide between the two non-symmetrical ports of the magic-tee in an indeterminate manner.

The waveguide discontinuity 36 may be placed in the other of the two non-symmetrical waveguide arms, i.e., waveguide arm 15, instead of waveguide arm 18. Although the discontinuity 36 is placed in waveguide arm 15 instead of arm 18, similar results are achieved, except with the roles of port 11 and port 14 being reversed. In this case, the combined power will emerge from port 11, and the power emerging from port 14 will be nulled. Thus, a waveguide discontinuity 36 placed in one of the non-symmetrical waveguide arms 15, 18 of the magic-tee coupler 10 can cause the oscillators 20, 22 to inter-injection lock in a controlled manner. Furthermore, with this locking established, the combined power 40 is drawn entirely to that waveguide arm in which the waveguide discontinuity 36 is located, and there is a deep null in the power directed to the other non-symmetrical waveguide arm not containing the discontinuity.

Figure 4:
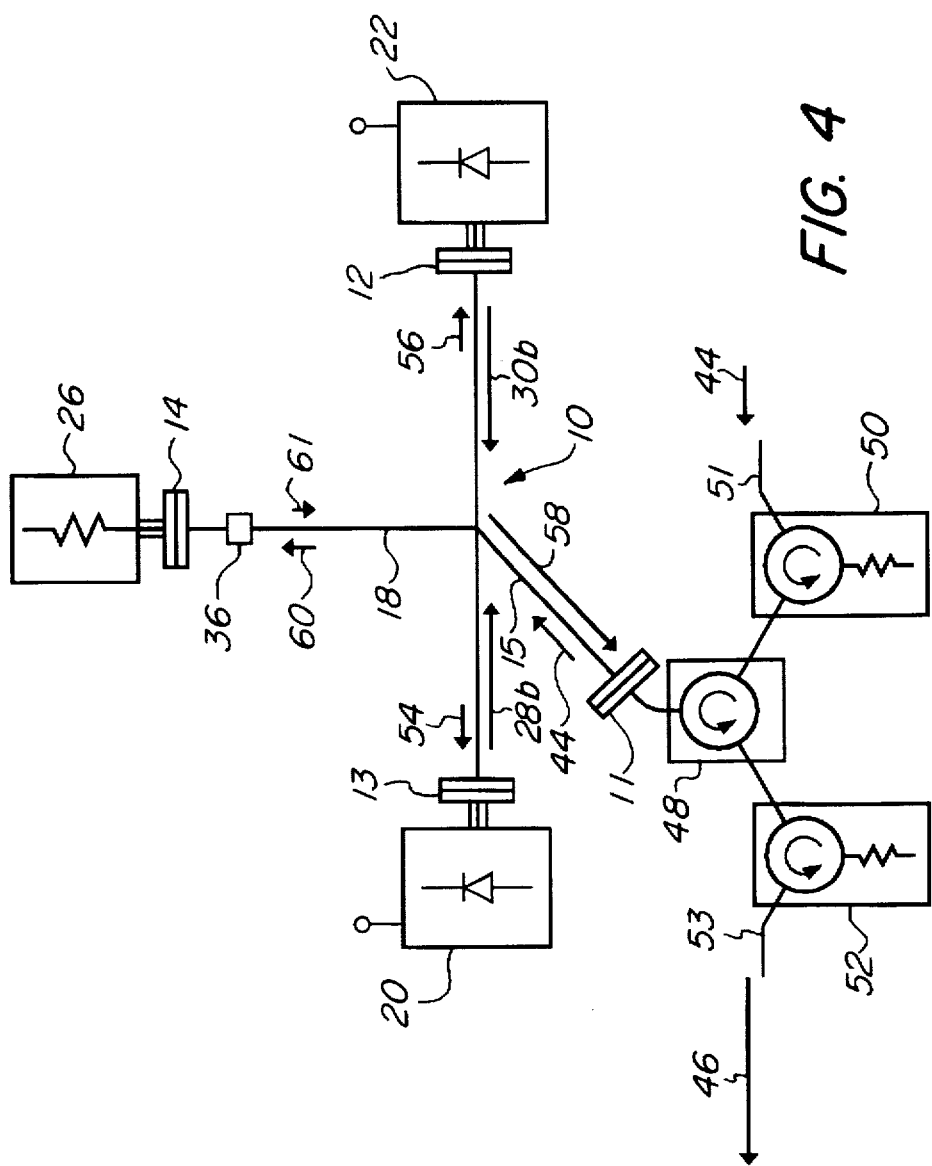
FIG. 4 is a schematic illustration of the reflection amplifier of the present invention similar to the configuration of FIG. 3 with the difference of a low return loss three-port circulator, along with input and output isolators, replacing the termination at the port of the non-symmetric waveguide arm not containing the discontinuity.

In a manner similar to FIG. 1, FIG. 4 schematically illustrates the full configuration of an amplifier embodying the present invention with the addition of signal flows. As compared with the schematic of FIG. 3, the waveguide termination 24 has been removed from port 11 of the magic-tee coupler 10, and, in the absence of the circulator 48, this port 11 becomes the RF input-output signal port of the amplifier. A three-port Y-junction ferrite circulator 48 having low return loss characteristics is coupled to port 11. It provides separate paths for the RF input 44 and the RF output signals 46. Also, a junction isolator 50, 52 having low return loss characteristics is coupled to each of the two remaining ports of the three-port circulator 48. A junction isolator is a Y-junction circulator with a low reflection termination installed on one of the three ports. The function of the isolators 50, 52 is to maintain a low reflection condition looking into the circulator from magic-tee port 11 in event that unmatched conditions are presented by either the external input signal source or the external output signal line. The waveguide discontinuity 36 in waveguide arm 18, and the termination 26 on port 14 remain.

When no RF input signal is applied to the input port 51 of input isolator 50, the circulator 48 with isolators 50, 52 presents a matched termination to port 11 of the magic-tee coupler 10. Therefore, when no external RF input signal 44 is applied, the amplifier operates in the idle mode and the same operating conditions prevail as in the configuration of FIG. 3.

FIG. 4 illustrates the amplification mode of operation of the reflection amplifier in which an external RF input signal 44, cw or pulsed, is applied to the input isolator 50. Signal amplification is accomplished through injection locking of the matched cw oscillator pair by the externally applied input signal 44. To achieve this injection locking condition, there are requirements on the frequency range and minimum amplitude of the externally applied input signal 44. These requirements will be specified later in this discussion. First, however, it will be assumed that the conditions on the frequency range and minimum amplitude of the externally applied signal 44 are satisfied to achieve injection locking of the matched oscillator pair, and the resulting characteristics of the configuration will be described.

Through action of the magic-tee, the externally applied input signal 44, which is injected into waveguide arm 15 of the magic-tee, divides equally into two signals 54, 56, and the relative phases between these two signals is 0-degrees or 180-degrees, depending on whether non-symmetrical waveguide arm 15 of the magic-tee into which the input signal is applied is the sum arm or the difference arm, respectively. Signals 54, 56, resulting from the equal split of applied input signal 44, are the input signals for the injection locking of the matched oscillator pair 20, 22. The outputs 28b, 30b of the injection locked oscillator pair maintain the same relative phase as the input signals. This phasing of the oscillator pair is, in-turn, the precise phasing which, through action of the 3 dB, 180-degree magic-tee hybrid coupler, will cause the oscillator output signals 28b, 30b to power combine with the resulting power combined output signal directed to the same waveguide arm 15 from which the external input signal 44 is applied.

Under the condition of injection locking to the externally applied input signal 44, in the ideal case no portion of the power combined output is directed into the waveguide arm 18 which contains the discontinuity 36. Therefore, the oscillators are isolated from the discontinuity during the amplification mode. Any residual level of power, represented by signal 60 in FIG. 4, that does enter waveguide arm 18 during the signal injection mode is a result of non-ideal finite isolation and return loss properties and symmetry imbalances of the magic-tee, and of imbalances between the injection locking characteristics of the oscillator pair. In practice, the effect of this small residual signal 60 directed into waveguide arm 18 during the amplification mode would normally be negligible. For amplification of pulsed signals, the depth of the null for the idle mode is of greatest significance, since this sets the effective power ON/OFF ratio of the amplifier. In most cases, fine tuning adjustments on the system would be made to maximize the idle mode null, and leaving as is the null in the power to the discontinuity during the amplification mode.

When operated in the described amplification mode, i.e., with an externally applied injection locking signal present with sufficient amplitude and within a to-be-specified frequency band, this reflection amplifier has essentially the same features of the conventional configuration used widely for injection locking and power combining a matched pair of cw oscillators using a 180-degree 3 dB hybrid coupler. The present invention differs with the addition of the waveguide discontinuity 36 whose function is to establish the described idle mode, thereby diverting oscillator power away from the amplifier output port when the input signal is removed.

It is important to consider the conditions for minimum amplitude and the limits to the frequency band of the externally generated RF input signal necessary to transfer operation out of the idle mode and into the amplification mode where the cw oscillator modules are injection locked to the externally applied input signal. For the conventional injection locked oscillator problem, described in detail in Kurokawa, supra, there is the Adler formula for injection locking which relates the injection locking bandwidth and the RF input power level. As the input signal power is increased, the injection locking bandwidth increases. However, for the described amplifier, there is a significant additional effect to be considered concerning the process of achieving injection locking to the external signal. The effect relates to the process of transferring out of the previously established state of inter-injection locking of the idle mode.

In the idle mode, the composite oscillation is an inter-injection locking of the oscillator pair as controlled by the discontinuity. As described previously, the discontinuity has some control in setting the frequency of the inter-injection locked oscillation. This frequency control is achieved by adjusting the amplitude of the reflection produced by the discontinuity and by adjusting the longitudinal position of the discontinuity which changes the relative phase between the injection locking input signal and the oscillator output. These parameters also have an effect on the characteristic external Q of the resulting inter-injection locked oscillation as could be characterized by analyzing the injection locking characteristics of the configuration when applying the injection locking signal through port 14, the terminal port of the waveguide arm containing the discontinuity. Therefore, the discontinuity contributes to determining the oscillation frequency and the Q of the inter-injection locked oscillation.

However, after the injection signal is applied at port 11, or 51 the port of the input isolator, and conditions are satisfied to accomplish locking, the discontinuity is then isolated from the oscillators, as explained above. In the amplification mode, the free-running frequency and external Q characteristics of the oscillators being injection locked are the characteristics of the individual oscillators without the effect of the reflection from the discontinuity. Therefore, in the transfer from the idle mode to the amplification mode, there is a transition in which the effective free-running frequency and external Q of the oscillator system being injection locked has changed.

Consider the case where the amplitude of the external signal applied to port 51 is increased continuously from a zero value. At the lowest levels of input signal, well before locking to the external signal is achieved, there is a free-running oscillation at the idle mode frequency which, depending on the effective amplitude and phase of the discontinuity, could have a frequency and external Q which are significantly different from that of the individual oscillators working into matched terminations. As the external signal is further increased in amplitude, at some level the injection locking of the oscillators to the external signal will be accomplished, and, as explained above, the oscillators are then isolated from the discontinuity. The effective free-running frequency and external Q to be applied to the Adler injection locking formula can be significantly different during the transient between the state of operation before injection locking is achieved and the state after injection locking to the external locking signal is accomplished. This implies that, unlike the conventional oscillator where the transition from the unlocked condition into the injection locked state is free of hysteresis, the transfer from the idle mode to the amplification mode of this amplifier can be characterized by significant hysteresis effects. This phenomenon concerning transfer from the inter-injection locked state of the idle mode to the externally injection locked state of the amplification mode has yet to be analyzed in detail.

Once the locking to the externally applied signal is accomplished, the oscillators are isolated from the discontinuity. Then, the input signal can be reduced in amplitude, and, as long as the oscillators remain locked to the external signal, the oscillators remain isolated from the discontinuity, and the effective external Q and free-running oscillator frequency characteristics of the device remain unchanged.

The existence of this hysteresis phenomenon in this amplifier rules out a simple application of the Adler formula to relate the externally applied RF input power and the bandwidth limits of the input signal to accomplish transfer from the idle mode to the amplification mode. Lacking a full analysis of this new phenomenon, a precise solution is not available. However, a conservative but probably dependable set of conditions can be proposed to specify the minimum amplitude and the frequency band limits required of the external RF input signal to accomplish transfer out of the idle mode and into the amplification mode. The Adler formula can be applied to two separate configurations of conventional injection locking. One is for the injection locking to an external input signal applied to amplifier port 11, or port 51, with the discontinuity 36 removed; in this case there is no inter-injection locked mode from which to transfer out. The second is for injection locking from an external input signal applied to amplifier port 14 with the discontinuity 36 in place in which case the inter-injection locked configuration is treated as a simple one port oscillator. For a fixed RF input power level, the two upper half bandwidths and two lower half bandwidths are calculated from the Adler formula, and the lesser of each pair of values is taken.

The analysis in reference 1 of the conventional injection locking problem describes the settling time for the transient associated with the transition from a free-running condition to injection locking following turn-on of the external signal. While the precise analytical expression describing the transient is relatively complex, the general time scale for the lock-up transient is on the order of the inverse of the injection locking bandwidth. The applicable injection locking bandwidth is a function of external Q and ratio of input power to oscillator output power. For a millimeter wave realization of the amplifier, sub-nanosecond transient times are readily achievable.

Since the described amplifier utilizes injection locking, there are finite settling times associated with the transition from the idle mode to the amplification mode following the turn-on of the externally applied signal, and with the transition back to the idle mode following turn-off of the externally applied signal. For an estimate of these times, the inverse of the applicable injection locking bandwidth can be utilized.

Thus, during the idle mode of operation, when no external RF input signal 44 is applied to the input port 51, the matched pair of cw oscillator modules 20, 22 are inter-injection locked to each other, thereby producing a single free-running frequency. This inter-injection locking is controlled by the discontinuity 36 located in non-symmetrical waveguide arm 18 of the magic-tee coupler 10. The outputs 28b, 30b, shown in FIG. 3, of the two oscillators 20, 22 are power combined, and the phasing of signals on the magic-tee coupler 10 is such that this combined power is directed into the waveguide termination 26 on the magic-tee coupler 10. With adequately matched characteristics of the two injection locked oscillators 20, 22, with adequate isolation and balance of the magic-tee coupler 10, and with sufficiently low return loss looking into circulator 48, shown in FIG. 4, from magic-tee port 11, the configuration can be controlled in such a manner that the power emerging from output port 53 of the amplifier during the idle mode can be made to null an estimated 35 dB or more down from the main combined power signal diverted into termination 26. Therefore, an ON/OFF ratio of 35 dB should be achievable when applied to the amplification of pulses.

During the amplification mode of operation when the externally applied RF input signal 44 is present with at least the minimum required amplitude and within the required frequency band, the matched pair of oscillators 20, 22 transfers to a condition of being injection locked to the externally applied signal, instead of being inter-injection locked as they are when no external signal is applied. With the external input signal 44 applied, the relative phases of the output signals 28b, 30b from the injection locked oscillators 20, 22 are such that the powers combine and the composite signal 58 is directed entirely to port 11, the same port from which the external locking signal 44 is input. In this mode the oscillators are effectively isolated from the waveguide discontinuity 36 in the waveguide arm 18 of the magic-tee coupler 10. When the external RF input signal 44 is removed, the amplifier returns to the idle mode and the combined output power of the oscillators switches paths being diverted to waveguide termination 26 attached to port 14.

Useful gain can be realized from this pulse amplifier configuration, and a high ON/OFF ratio can be achieved. The power generated by the matched pair of cw injection locked oscillator modules 20, 22 may be used for high spectral purity pulse amplification of fast rise-time and fall-time pulsed microwave signals. For the microwave range of frequencies above the useful fundamental mode range of operation of Gunn and IMPATT devices, these devices may be operated utilizing their harmonic output to obtain a higher frequency range of operation, since these devices can made to injection lock at the harmonic frequency.

As will be appreciated, alternate embodiments of the present invention may be utilized to amplify electromagnetic radiation beyond the microwave spectrum. For example, in order to amplify lightwaves, the waveguide components used herein may be replaced with components fabricated in other types of transmission media including fiberoptics, and other types of oscillators may be used such as lasers.

Figure 5:
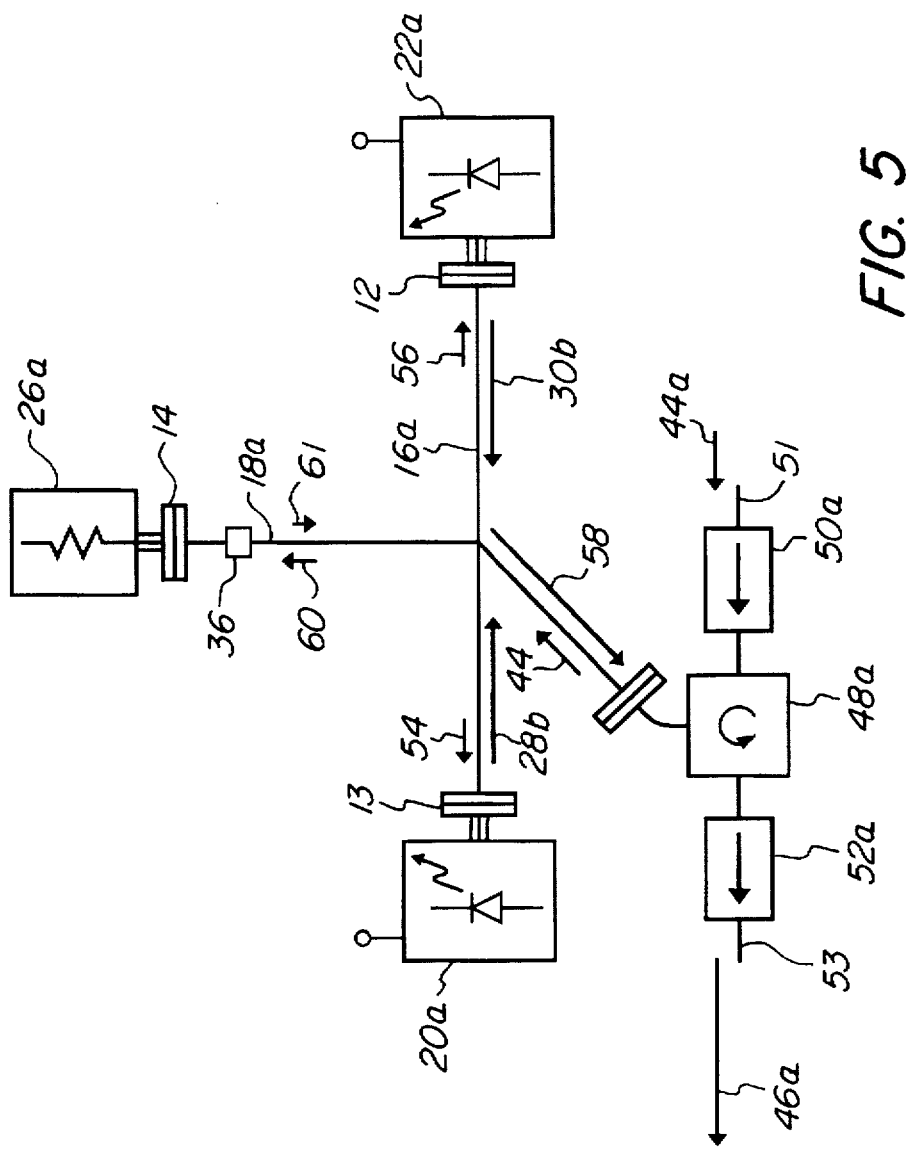
FIG. 5 is a view similar to FIG. 4 of a reflection amplifier of the present invention using lightwave components.

FIG. 5 illustrates an alternate embodiment of the reflection amplifier which uses lightwave components for the amplification of pulsed lightwave signals useful in extremely high-speed, high capacity data transmission applications. In general, there is a one-to-one correspondence between the microwave components illustrated in FIGS. 1-4, and the lightwave components illustrated in FIG. 5. The lightwave components include a fiberoptic optical waveguide 16a, 18a, matched optical termination 26a, a matched pair of cw lasers 20a, 22a, optical circulator 48a, and optical isolators 50a and 52a.

All of the signals in the lightwave embodiment illustrated in FIG. 5 correspond to the microwave signals illustrated in FIGS. 1-4 except that the input and output signals 44a, 46a, respectively, have optical frequencies which are above 200 Ghz, instead of microwave frequencies which are in the range of 1-200 Ghz. In all other respects, the operation of the microwave amplifier illustrated in FIGS. 1-4 and the lightwave amplifier illustrated in FIG. 5 are identical.

As will be further appreciated, the configuration of several components may vary from that which is illustrated in the accompanying drawings. For example, although a magic-tee coupler is used in the illustrations, other types of 3 dB 180-degree hybrid couplers can be used. The waveguide termination may be a conventional matched waveguide load containing absorbing material, or it may be any low reflection waveguide component or component system which presents a low return loss condition looking into it from the terminal port of the non-symmetric magic-tee arm containing the discontinuity. Also, the combination of waveguide discontinuity 36 and reflectionless waveguide termination 26 can be replaced by a termination having a finite return loss of controlled amplitude and phase. Most conveniently, in the microwave embodiment, the one-port cw injection locked oscillator modules 20, 22 typically employ two-terminal Gunn or IMPATT active devices. In the lightwave embodiment, the oscillators are typically diode lasers but essentially any type of laser may be adapted for use, including gas lasers.

Moreover, a circulator is included for most applications. Insofar as the circulator is concerned, the microwave embodiment typically includes a Y-junction circulator utilizing magnetized ferrite which serve as a low-loss non-reciprocal medium for components at microwave frequencies. The lightwave embodiment typically includes a circulator utilizing a non-reciprocal Faraday rotation crystalline material.

Thus, it can be seen from the foregoing detailed description and accompanying drawings that the novel reflection amplifier of the present invention is one which effectively achieves high spectral purity pulsed amplification of fast rise-time and fall-time pulsed microwave and lightwave signals using a pair of continuously running (cw) injection locked oscillator modules.

Having thus described the invention, what is claimed is:

1. An electromagnetic radiation reflection amplifier comprising:

(a) a 180-degree hybrid coupler including two symmetric waveguide arms, a sum waveguide arm and a difference waveguide arm, each of said waveguide arms having terminal ports;

(b) a matched pair of one-port cw oscillator modules mounted on said ports on said symmetric waveguide arms;

(c) a waveguide discontinuity mounted within one of said sum and difference waveguide arms intermediate of its ends;

(d) a low reflection waveguide termination attached to said one arm containing said discontinuity;

(e) means for inputting a signal into said port of the other of said sum and difference waveguide arms while maintaining a low return loss terminating condition on that arm, said means for inputting having:

(i) an idle mode of operation during which said oscillator modules are operated in continuous wave mode whereby said oscillator modules inter-injection lock to produce a single-frequency, free-running power combined output signal which is directed into said waveguide termination, and a deep null is achieved in the power delivered to said port of the other of said sum and difference waveguide arms, (ii) an amplification mode of operation during which said means for inputting inputs a signal into said port of the other of said sum and difference waveguide arms, said oscillator modules being operated in a continuous wave mode, and said input signal being sufficiently high in amplitude to cause transfer from the inter-injection locked condition controlled by said waveguide discontinuity in the absence of an input signal, to a condition of injection locking of said oscillator modules by the externally applied input signal, whereby said oscillator modules power combine and produce an amplified output signal which is directed into said port of the other of said sum and difference waveguide arms, and a null is achieved in the output power delivered to said waveguide termination, and (iii) an unlocked mode in which a finite external signal is input with insufficient amplitude to transfer operation of said pair of oscillator modules to a condition in which they become injection locked to said externally applied input signal, and said oscillator modules would emit multiple frequencies and spurious outputs.

2. The amplifier according to claim 1 wherein said means for inputting a signal includes a circulator having three waveguide arms having terminal ports, said first port of said circulator being mounted on said port of the other of said sum and difference arms, said input signal being applied to said second port of said circulator during said amplification mode of operation, whereby a deep null is achieved in the power delivered to said first port of said circulator and out of said third port of said circulator during said idle mode of operation, said amplified output signal being steered into said first port of said circulator and out of said third port of said circulator during said amplification mode of operation.

3. The amplifier according to claim 2 wherein said means for inputting a signal includes an isolator coupled to said second port of said circulator, and an isolator coupled to said third port of said circulator.

4. The amplifier according to claim 2 wherein said circulator is a magnetized ferrite Y-junction circulator.

5. The amplifier according to claim 2 wherein said circulator is a crystalline Faraday rotation circulator.

6. The amplifier according to claim 1 wherein said 180-degree hybrid coupler is a 3 dB magic-tee coupler.

7. The amplifier according to claim 6 wherein the phasing of said 180-degree hybrid coupler enables the power combining of the output signals from said oscillator modules into a single frequency output signal by injection locking.

8. The amplifier according to claim 1 wherein said oscillator modules have approximately matched free-running frequencies and output amplitudes, whereby said oscillator modules inter-injection lock resulting in a single power combined free-running frequency, and this power is directed into a waveguide termination.

9. The amplifier according to claim 8 wherein the frequency of said input signal is within a frequency band approximately centered at said individual oscillator free-running frequency, and the amplitude of said input signal satisfies the minimum requirement to cause said oscillator modules to transfer from the inter-injection locked condition to a condition of injection locking to the externally input signal, and the resulting power combined signal is available as an amplified output signal.

10. The amplifier according to claim 1 wherein said waveguide discontinuity is disposed longitudinally along said one of said sum and difference waveguide arms, and the amplitude of the reflection coefficient of the discontinuity is adjusted to control the inter-injection locking of said oscillator modules.

11. The amplifier according to claim 1 wherein said oscillator modules utilize two-terminal Gunn type diodes.

12. The amplifier according to claim 1 wherein said oscillator modules utilize two-terminal IMPATT type diodes.

13. The amplifier according to claim 1 wherein said oscillator modules are lasers.

14. The amplifier according to claim 1 wherein the phasing of said 180-degree hybrid coupler enables the power combining of the output signals from said oscillator modules into a single-frequency output signal by injection locking, said oscillator modules individually having approximately matched free-running frequencies and output amplitudes, the frequency of said input signal approximating the frequency of said single free-running oscillator frequencies and said amplitude of said input signal being sufficient to cause said oscillator modules to injection lock to the externally applied input signal and to power combine resulting in a single output frequency, said waveguide discontinuity being disposed longitudinally along said one of said sum and difference waveguide arms to control the inter-injection locking of said oscillator modules during the idle mode.

15. The amplifier according to claim 14 wherein said oscillator modules each utilize a two-terminal Gunn type diode, said means for inputting a signal including a Y-junction magnetized ferrite circulator having three waveguide arms having terminal ports, the first port of said circulator being mounted on said port of the other of said sum and difference waveguide arms, said input signal being applied to the second port of said circulator during said amplification mode of operation, whereby a deep null is achieved in the power delivered to the first port of said circulator and out of the third port of said circulator during said idle mode of operation, and said amplified output signal being steered into said first port of said circulator and out of said third port of said circulator during said amplification mode of operation.

16. The amplifier according to claim 15 wherein said oscillator modules each utilize a two-terminal IMPATT type diode, said means for inputting a signal including a Y-junction magnetized ferrite circulator having three waveguide arms having terminal ports, the first port of said circulator being mounted on said port of the other of said sum and difference waveguide arms, said input signal being applied to the second port of said circulator during said amplification mode of operation, whereby a deep null is achieved in the power delivered to said first port of said circulator and out of the third port of said circulator during said idle mode of operation, said amplified output signal being steered into said first port of said circulator and out of the third port of said circulator during said amplification mode of operation.

17. The amplifier according to claim 1 wherein said oscillator modules are lasers, wherein said means for inputting a signal includes a crystalline Faraday rotation circulator having three waveguide arms having terminal ports, the first port of said circulator being mounted on said port of the other of said sum and difference waveguide arms, said input signal being applied to the second port of said circulator during said amplification mode of operation, whereby a deep null is achieved in the power delivered to said first port of said circulator and out of the third port of said circulator during said idle mode of operation, and said amplified output signal being steered into said first port of said circulator and out of said third port of said circulator during said amplification mode of operation.

* * * * *